(12) United States Patent
Yoshizawa et al.

(10) Patent No.: US 6,426,646 B2
(45) Date of Patent: Jul. 30, 2002

(54) ECL TERMINATING CIRCUIT

(75) Inventors: Munetoshi Yoshizawa; Masashi Tachigori, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/851,079

(22) Filed: May 9, 2001

(30) Foreign Application Priority Data

May 10, 2000 (JP) ........................................ 2000-142320

(51) Int. Cl.[7] .............................................. H03K 19/003
(52) U.S. Cl. ............................................ 326/30; 326/90
(58) Field of Search ............................. 326/30, 89, 90, 326/124, 126

(56) References Cited

U.S. PATENT DOCUMENTS 6,064,248 A * 5/2000 Seki ........................... 327/296
6,208,161 B1 * 3/2001 Suda .......................... 326/30
6,212,586 B1 * 4/2001 Mros et al. .................... 326/90

\* cited by examiner

Primary Examiner—Don Phu Le
(74) Attorney, Agent, or Firm—Young & Thompson

(57) ABSTRACT

An ECL terminating circuit, in which it is prevented that the amplitude of an output signal from an ECL outputting circuit or a PECL outputting circuit is lowered caused by that the supply voltage for the circuit has been lowered, and also it is prevented that the waveform of the output signal is deteriorated caused by that the distance of a transmission line where the output signal being high speed is transmitted is made to be long, is provided. The ECL terminating circuit consists of a PECL outputting circuit, a resistor, a transmission line, a load circuit, and a terminal element. And the terminal element is connected to the resistor in series and the resistance value of the terminal element is about 0 Ω at a direct current (DC), but is made to be large at an alternating current (AC).

8 Claims, 4 Drawing Sheets

F I G. 4
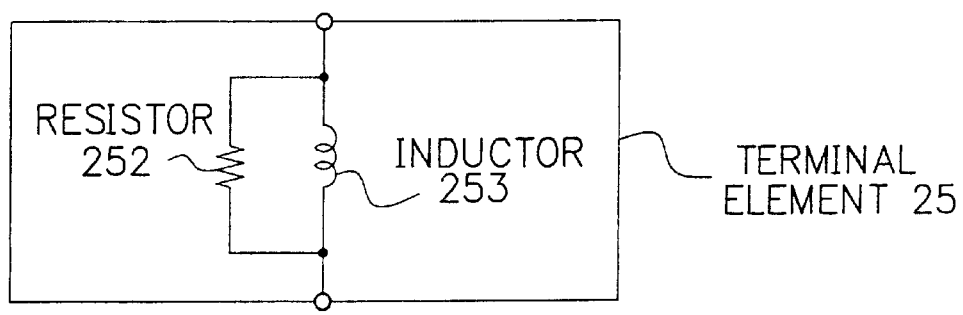
F I G. 5
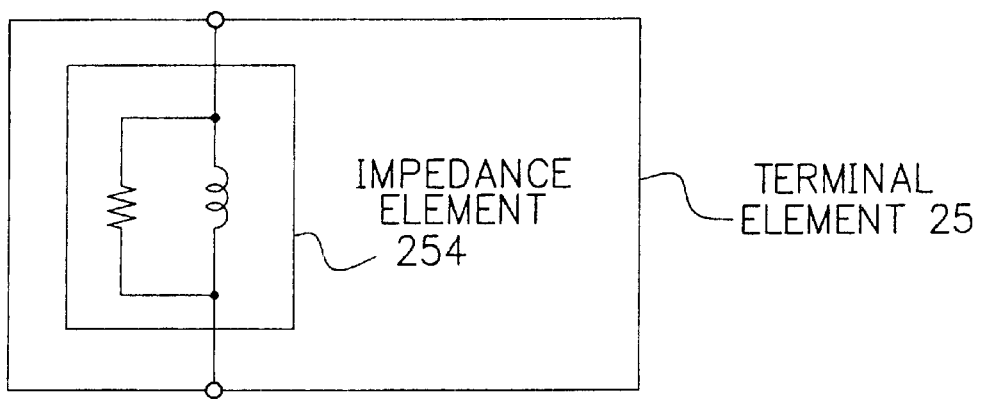

ECL TERMINATING CIRCUIT

BACKGROUND OF THE INVENTION

The present invention relates to an emitter coupled logic (ECL) terminating circuit which terminates an output end of an ECL outputting circuit or a pseuo emitter coupled logic (PECL) outputting circuit that is used at digital telecommunication.

DESCRIPTION OF THE RELATED ART

At digital telecommunication equipment using an ECL outputting circuit or a PECL outputting circuit, its supply voltage has been lowered, consequently, it has been difficult to secure a desirable amplitude of a signal outputted from the ECL outputting circuit or the PECL outputting circuit in, and also to secure good wiring of a signal transmission line for the outputted signal.

FIG. 1 is a block diagram showing a structure of a conventional ECL terminating circuit. Referring to FIG. 1, the structure of the conventional ECL terminating circuit is explained.

Generally, when a high speed PECL signal is transmitted through a transmission line, at the case that the distance of the transmission line becomes long, it is necessary that a terminal resistance of 50 Ω is loaded. As shown in FIG. 1, this conventional ECL terminating circuit consists of a PECL outputting circuit 51, a resistor 52, a transmission line 53, and a load circuit 54. And the output end of an NPN transistor 511 in the PECL outputting circuit 51 is connected to one end of the resistor 52 and one end of the transmission line 53, and the other end of the transmission line 53 is connected to the load circuit 54 whose input impedance is 50 Ω.

Consequently, the load impedance for the PECL outputting circuit 51 becomes a resistance value that the resistance value of the resistor 52 and the input impedance 50 Ω of the load circuit 54 are added in parallel. As a result, the load impedance for the PECL outputting circuit 51 becomes lower than 50 Ω, and there is a problem that the amplitude of the output signal from the PECL circuit 51 becomes small.

And it is possible that the load impedance for the PECL outputting circuit 51 is made to be almost equal to 50 Ω by that the resistance value of the resistor 52 is made to be large. However, when the resistance value of the resistor 52 is made to be large, the output current from the NPN transistor 511 becomes small, and the desirable amplitude of the output signal from the PECL outputting circuit 51 can not be secured. Further, recently, the supply voltage for the circuit has been lowered, and the resistance value of the resistor 52 must be lowered, if not, the output current from the NPN transistor becomes small. And when the resistance value of the resistor 52 is made to be large, as mentioned above, the desirable amplitude of the output signal from the PECL outputting circuit 51 can not be secured.

SUMMARY OF THE INVENTION

It is therefore an object of the present invention to provide an ECL terminating circuit, in which it is prevented that the amplitude of an output signal from an ECL outputting circuit or a PECL outputting circuit is lowered caused by that the supply voltage for the circuit has been lowered, and also it is prevented that the waveform of the output signal is deteriorated caused by that the distance of a transmission line where the output signal being high speed is transmitted is made to be long.

According to a first aspect of the present invention, there is provided an ECL terminating circuit, which terminates the output end of an ECL outputting circuit or a PECL outputting circuit using at digital telecommunication. And the ECL terminating circuit provides a terminating means that is connected in series to a resistor connecting to the output end of the ECL outputting circuit or the PECL outputting circuit, and a resistance value of the terminating means becomes about 0 Ω at a direct current (DC) and the resistance value of the terminating means becomes large at an alternating current (AC).

According to a second aspect of the present invention, in the first aspect, the terminating means is an inductor.

According to a third aspect of the present invention, in the first aspect, the terminating means is composed of that an inductor and a resistor are connected in parallel.

According to a fourth aspect of the present invention, in the third aspect, the terminating means is an impedance element having an equivalent function to that an inductor and a resistor are connected in parallel.

According to a fifth aspect of the present invention, there is provided an ECL terminating circuit, which terminates the output end of an ECL outputting circuit or a PECL outputting circuit using at digital telecommunication. And the ECL terminating circuit provides a first resistor whose one end is connected to the output end of the ECL outputting circuit or the PECL outputting circuit that is used, a 50 Ω transmission line whose one end is connected to the output end of the ECL outputting circuit or the PECL outputting circuit that is used, a terminal element whose one end is connected to the other end of the first resistor and whose the other end is connected to ground, and whose resistance value is about 0 Ω at a DC and becomes large at an AC, and a load circuit that is connected to the other end of the 50 Ω transmission line and whose input impedance is about 50 Ω.

According to a sixth aspect of the present invention, in the fifth aspect, the terminal element is an inductor whose one end is connected to the the other end of the first resistor and the other end is connected to ground.

According to a seventh aspect of the present invention, in the fifth aspect, the terminal element is composed of an inductor and a second resistor, and the inductor and the second resistor are connected in parallel, and one end of the terminal element is connected to the other end of the first resistor and the other end of the terminal element is connected to ground.

According to an eighth aspect of the present invention, in the fifth aspect, the terminal element is an impedance element having an equivalent function to that an inductor and a resistor are connected in parallel, and one end of the impedance element is connected to the other end of the first resistor and the other end of the impedance element is connected to ground.

BRIEF DESCRIPTION OF THE DRAWINGS

The objects and features of the present invention will become more apparent from the consideration of the following detailed description taken in conjunction with the accompanying drawings in which:

FIG. 4 is a circuit diagram showing one alternative structure of a terminal element at the embodiment of the ECL terminating circuit of the present invention; and FIG. 5 is a circuit diagram showing the other alternative structure of the terminal element at the embodiment of the ECL terminating circuit of the present invention.

DESCRIPTION OF THE PREFERRED EMBODIMENT

Figure 1:
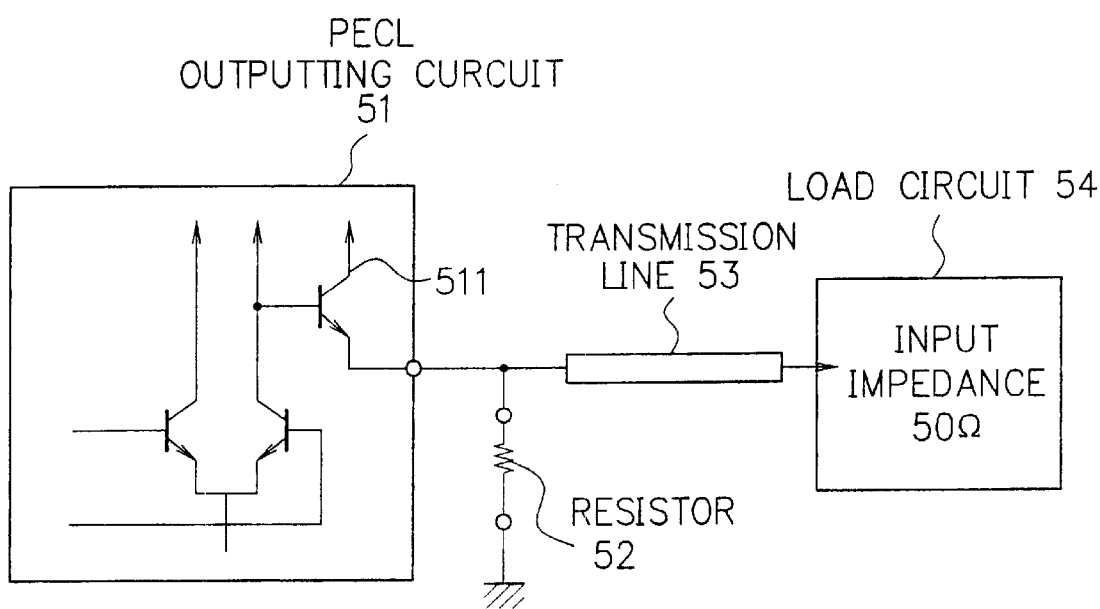
FIG. 1 is a block diagram showing a structure of a conventional ECL terminating circuit.

The present invention is a technology for a terminating circuit of an ECL outputting circuit or a PECL outputting circuit using in digital telecommunication. And about 50 Ω terminating impedance is made to be possible at a low supply voltage. Referring now to the drawings, an embodiment of the present invention is explained in detail.

Figure 2:
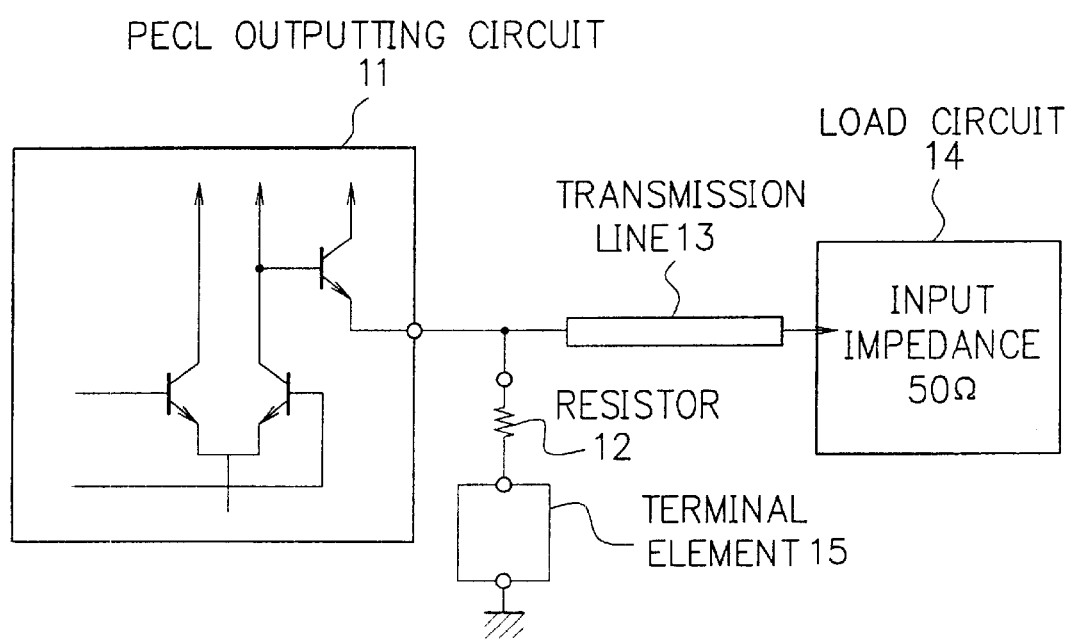
FIG. 2 is a block diagram showing a basic structure of an embodiment of an ECL terminating circuit of the present invention.

FIG. 2 is a block diagram showing a basic structure of the embodiment of an ECL terminating circuit of the present invention. Referring to FIG. 2, the embodiment of the ECL terminating circuit of the present invention is explained in detail.

As shown in FIG. 2, the embodiment of the ECL terminating circuit of the present invention consists of a PECL outputting circuit 11, a resistor 12, a transmission line 13, a load circuit 14, and a terminal element 15. As shown in FIG. 2, the terminal element 15 is newly provided in the ECL terminating circuit of the present invention, compared with the conventional ECL terminating circuit shown in FIG. 1. The resistance value of the terminal element 15 is about 0 Ω at a direct current (DC), but is made to be large at an alternating current (AC).

Therefore, the resistance value at the resistor 12 and the terminal element 15 is the resistance value of only the resistor 12 at DC, but at AC, the resistance value is that the resistance values of the resistor 12 and the terminal element 15 are added in series, and the resistance value at the AC is higher than at the DC. Consequently, at the AC, the load impedance for the PECL outputting circuit 11 is made to be near to 50 Ω, and the desirable amplitude of the output signal from the PECL outputting circuit 11 can be secured.

Figure 3:
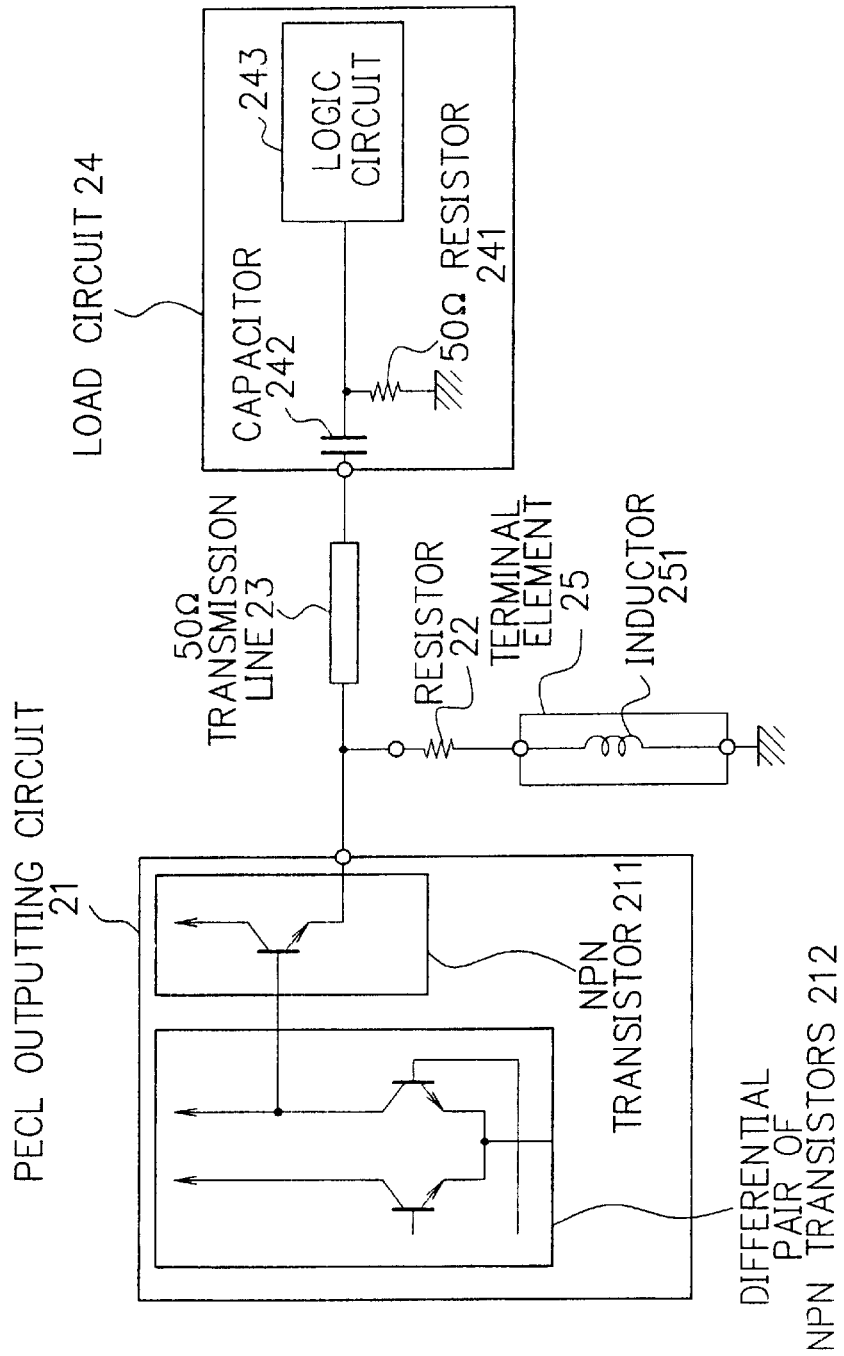
FIG. 3 is a block diagram showing a detailed structure of the embodiment of the ECL terminating circuit of the present invention.

FIG. 3 is a block diagram showing a detailed structure of the embodiment of the ECL terminating circuit of the present invention. As shown in FIG. 3, the embodiment of the ECL terminating circuit of the present invention consists of a PECL outputting circuit 21, a resistor 22, a 50 Ω transmission line 23, a load circuit 24, and a terminal element 25. And the PECL outputting circuit 21 consists of an NPN transistor 211 and a differential pair of NPN transistors 212, and the load circuit 24 consists of a 50 Ω resistor 241, a capacitor 242, and a logic circuit 243 whose input impedance is much higher than 50 Ω. And the terminal element 25 is an inductor 251 whose resistance value is about 0 Ω at DC.

FIG. 4 is a circuit diagram showing one alternative structure of the terminal element 25 at the embodiment of the ECL terminating circuit of the present invention. As shown in FIG. 4, the terminal element 25 consists of a resistor 252 and an inductor 253, and the resistor 252 and the inductor 253 are connected in parallel. And one end of the terminal element 25 is connected to the resistor 22, and the other end of the terminal element 25 is connected to ground.

FIG. 5 is a circuit diagram showing the other alternative structure of the terminal element 25 at the embodiment of the ECL terminating circuit of the present invention. As shown in FIG. 5, the terminal element 25 is an impedance element 254 that has an equivalent function to the terminal element 25 shown in FIG. 4 in which the resistor 252 and the inductor 253 are connected in parallel.

Next, referring to FIG. 3, operation of the embodiment of the ECL terminating circuit of the present invention is explained in detail. The output end of the PECL outputting circuit 21 is connected to one end of the resistor 22 having a resistance value R1 and also one end of the 50 Ω transmission line 23. The other end of the resistor 22 is connected to the terminal element 25 having an impedance value Z2, and the other end of the terminal element 25 is connected to ground. And the other end of the 50 Ω transmission line 23 is connected to the load circuit 24 whose input impedance Z3.

Therefore, a load impedance value for the PECL outputting circuit 21 is a resistance value that a resistance value composed of the resistor 22 and the terminal element 25, and the input impedance of the load circuit 24 are added in parallel. In this, the resistance value composed of the resistor 22 and the terminal element 25 is a resistance value that the resistance values of the resistor 22 and the terminal element 25 are added in series. An impedance value Z1 that the resistance value R1 of the resistor 22 and the resistance value Z2 of the terminal element 25 are added in series at AC is shown in an equation (1).

$$Z1=R1+Z2 \qquad (1)$$

And the input impedance Z3 of the load circuit 24 becomes 50 Ω, because the input impedance value of the logic circuit 243 is high enough for 50 Ω. Therefore, the load impedance Z4 for the PECL outputting circuit 21 becomes a resistance value that the Z1 and 50 Ω are added in parallel, and the Z4 is shown in an equation (2).

$$Z4=Z1\times 50/(Z1+50) \qquad (2)$$

And the equation (2) can be written in an equation (3)

$$Z4=(R1+Z2)\times 50/(R1+Z2+50) \qquad (3)$$

And at a high frequency, Z2>>R1, and Z2>>50, therefore the equation (3) can be written in an equation (4).

$$Z4=(1+Z2/R1)\times 50/(1+Z2/R1+50/R1) \qquad (4)$$

Further, Z2/R1≈0, 50/R1 ≈0, therefore Z4≈50 Ω. Therefore, even if the value of Z2 is not made to be large, it is possible that 50 Ω termination is realized at DC.

Generally, the resistance value R1 of the resistor 22 connecting to the PECL outputting circuit 21 operated by +3.3 V is about 130 Ω. The load impedance Z4 for the conventional PECL outputting circuit 51 is about 36 Ω. However, at the present invention, when the inductor 251 having about 100 nH is used, the impedance value Z2 of the terminal element 25 becomes about 240 Ω at 2.5 GHz, and the load impedance Z4 for the PECL outputting circuit 21 is improved to about 44 Ω.

As mentioned above, according to the present invention, lowering the amplitude of an output signal from an ECL outputting circuit or a PECL outputting circuit caused by that the supply voltage for the circuit has been lowered is prevented. And also deteriorating the waveform of the output signal caused by that the distance of a transmission line where the output signal being high speed is transmitted is made to be long is prevented.

While the present invention has been described with reference to the particular illustrative embodiment, it is not to be restricted by that embodiment but only by the appended claims. It is to be appreciated that those skilled in the art can change or modify the embodiments without departing from the scope and spirit of the present invention.

What is claimed is:

1. An emitter coupled logic (ECL) terminating circuit, which terminates the output end of an ECL outputting circuit or a pseudo emitter coupled logic (PECL) outputting circuit using at digital telecommunication, comprising:

a terminating means that is connected in series to a resistor connecting to said output end of said ECL outputting circuit or said PECL outputting circuit, and a resistance value of said terminating means becomes about 0 Ω at a direct current (DC) and said resistance value of said terminating means becomes large at an alternating current (AC).

2. An ECL terminating circuit in accordance with claim 1, wherein:

said terminating means is an inductor.

3. An ECL terminating circuit in accordance with claim 1, wherein:

said terminating means is composed of that an inductor and a resistor are connected in parallel.

4. An ECL terminating circuit in accordance with claim 1, wherein:

said terminating means is an impedance element having an equivalent function to that an inductor and a resistor are connected in parallel.

5. An ECL terminating circuit, which terminates the output end of an ECL outputting circuit or a PECL outputting circuit using at digital telecommunication, comprising:

a first resistor whose one end is connected to said output end of said ECL outputting circuit or said PECL outputting circuit that is used;

a 50 Ω transmission line whose one end is connected to said output end of said ECL outputting circuit or said PECL outputting circuit that is used;

a terminal element whose one end is connected to the other end of said first resistor and whose the other end is connected to ground, and whose resistance value is about 0 Ω at a DC and becomes large at an AC; and a load circuit that is connected to the other end of said 50 Ω transmission line and whose input impedance is about 50 Ω.

6. An ECL terminating circuit in accordance with claim 5, wherein:

said terminal element is an inductor whose one end is connected to said the other end of said first resistor and the other end is connected to ground.

7. An ECL terminating circuit in accordance with claim 5, wherein:

said terminal element is composed of an inductor and a second resistor, and said inductor and said second resistor are connected in parallel, and one end of said terminal element is connected to the other end of said first resistor and the other end of said terminal element is connected to ground.

8. An ECL terminating circuit in accordance with claim 5, wherein:

said terminal element is an impedance element having an equivalent function to that an inductor and a resistor are connected in parallel, and one end of said impedance element is connected to the other end of said first resistor and the other end of said impedance element is connected to ground.

* * * * *